United States Patent [19]
Rolandi

[11] Patent Number: 6,156,610
[45] Date of Patent: *Dec. 5, 2000

[54] PROCESS FOR MANUFACTURING AN EEPROM HAVING A PERIPHERAL TRANSISTOR WITH THICK OXIDE

[75] Inventor: Paolo Rolandi, Voghera, Italy

[73] Assignee: SGS-Thomason Microelectronics S.r.l., Agrate Brianza, Italy

[ * ] Notice: This patent issued on a continued prosecution application filed under 37 CFR 1.53(d), and is subject to the twenty year patent term provisions of 35 U.S.C. 154(a)(2).

[21] Appl. No.: 08/840,327

[22] Filed: Apr. 28, 1997

[30] Foreign Application Priority Data

Apr. 30, 1996 [EP] European Pat. Off. ............. 96830244

[51] Int. Cl.⁷ .................. H01L 21/8238; H01L 21/336; H01L 29/792
[52] U.S. Cl. .................. 438/258; 438/201; 438/211; 438/216; 438/257; 438/266; 257/324; 257/326
[58] Field of Search .................. 438/258, 201, 438/211, 216, 257, 266; 257/316, 324, 326

[56] References Cited

U.S. PATENT DOCUMENTS 5,104,819  4/1992  Freiberger et al. .................. 437/43

FOREIGN PATENT DOCUMENTS 0 542 575   5/1993   European Pat. Off. .
31 07 543  12/1981   Germany .
2 167 602   5/1986   United Kingdom .

*Primary Examiner*—Brian Dutton
*Assistant Examiner*—Neal Berezny
*Attorney, Agent, or Firm*—Jenkens & Gilchrist, P.C.; Theodore E. Galanthay

[57] ABSTRACT

A process for manufacturing an integrated circuit provides for the formation of a matrix of floating-gate non-volatile memory cells having dual polysilicon levels, with the two polysilicon levels being isolated by a gate dielectric layer (4) and an interpoly dielectric layer (9) therebetween, and for the concurrent formation of one type of thick-oxide transistor (21) having an active area (7) in regions peripheral to the matrix. The process of the invention provides for removal, during the step of defining the first-level polysilicon (5), the polysilicon (5) from the active area (7) of the thick-oxide transistor (21), so that the gate oxide of the transistor (21) results from the superposition of the first (4) and second (9) dielectric layers.

25 Claims, 3 Drawing Sheets

(A-A')

(B-B')

PROCESS FOR MANUFACTURING AN EEPROM HAVING A PERIPHERAL TRANSISTOR WITH THICK OXIDE

FIELD OF THE INVENTION

This invention relates to a process for manufacturing integrated circuits which include non-volatile memory cells and peripheral transistors.

BACKGROUND OF THE INVENTION

Most up-to-date applications of integrated circuits concern systems which are supplied voltages in the 3-volt range. Such systems often utilize semiconductor storage facilities of the non-volatile type. In order to retain the characteristics of these devices at low supply voltages, it has been necessary to employ thin oxides (160 Å-thick or less). However, it is well recognized that memories of the EPROM, EEPROM, FLASH types require high programming voltages (12V) which cannot be accommodated by such thin oxides. Accordingly, the requirement involves the concurrent provision of thick and thin oxides in one device, which burdens the process technology with at least one additional masking operation.

As for the peripheral transistors, these are incorporated in circuits outside the array of memory cells, such as array control logics or circuits, and are frequently expected to withstand high voltages, on the order of 12 to 15 volts. In describing this invention, reference will be made specifically to transistors of the MOS type.

Such transistors include an active dielectric, or gate dielectric, placed between the substrate and a gate made of an electrically conductive material, usually polysilicon. In general, the active dielectric consists of a layer of silicon oxide obtained by oxidation of the substrate at a high temperature.

PRIOR ART

Processes for manufacturing integrated structures which include non-volatile memory cells, i.e. cell matrices set up into rows and columns, using dual levels of polysilicon with a gate dielectric layer and an isolating interpoly dielectric layer therebetween, have been known and extensively used in the industry.

Such manufacturing processes may provide for a first masking and implanting step effective to define well regions having conductivity of a different type from that of the semiconductor substrate, in order to provide N-channel and P-channel devices on one chip. Conventional processes essentially utilize, therefore, one mask to define the active areas of the individual integrated devices (transistors, floating-gate memory cells, etc.). The process normally provides for an additional masking step, in order to form field isolation implants, that is, to have the semiconductor implanted in those zones where a thick oxide layer will be later grown to define and isolate the individual active areas.

The process may provide for an ATP (Anti-Punch Through) implantation of all those active areas that have the same type of conductivity. A relatively heavy threshold-raising implantation (EPM) is performed in the matrix area where the floating-gate memory cells are to be formed. A thin layer of gate oxide is then grown over the active areas. Subsequent to the depositing and doping of a first-level polysilicon layer (poly 1), a masking and etching step is usually carried out for a first definition of the first-level polysilicon that is to provide the floating gates for the memory cells.

A thin dielectric layer is next grown and/or deposited over the entire structure to isolate the two polysilicon levels (interpoly). This thin dielectric isolation layer may be a multiple layer, typically comprised of a first oxidation layer, a thin second layer of deposited silicon nitride, and a third nitride oxidation layer (the so-called O.N.O. multi-layer). At this stage, a masking step is typically carried out in such processes using a mask commonly referred to as the "matrix mask", thereby to remove the interpoly dielectric isolation layer from all over the surface except the area being occupied by the memory cells (matrix). Thereafter, a second-level doped polysilicon layer is deposited which, in the formation area of the floating-gate memory cells, will thus be isolated from the interpoly dielectric layer by the first-level polysilicon portions previously defined. On the other hand, the second layer of doped polysilicon will directly overlie the existing first-level layer of polysilicon, in areas outside the area being occupied by the memory cell matrix, that is the areas where the transistors and other external circuit devices are formed.

Conventional processes may also require a masking step specifically to perform an implantation, known as the LVS (Light Voltage Shift) implant, for slightly adjusting the threshold of standard enhancement transistors in the circuitry, with the channel areas of the so-called "natural" (or low threshold) transistors screened off the LVS implant. By an additional masking (poly 2) and etching step, the second-level polysilicon is defined which, in the matrix area, is terminated at the interpoly dielectric layer and, in the circuit area, also results in the underlying first-level polysilicon being defined, thereby defining the channel length of the transistors in the circuit.

A manufacturing process as described above is disclosed in prior Italian Patent Application No. 23737-A/84 and, inter alia, the corresponding patent publication GB-2,167,602, both in the name of this Applicant. It is intended that the contents of these prior publications be incorporated herein by reference, wherever appropriate.

What is needed is a process for forming non-volatile memory cells and thick-oxide peripheral transistors by a minimum number of steps, and accordingly, for lower production costs.

SUMMARY OF THE INVENTION

Accordingly, the present invention provides a process for manufacturing a thick-oxide transistor having an active area region in an integrated circuit which also includes a matrix area of floating-gate non-volatile memory cells having dual polysilicon levels isolated from each other by a gate dielectric layer and an interpoly dielectric layer therebetween. The process comprises an optional step for defining well regions. The process further comprises at least one masking step for defining the active areas of individual integrated devices, a masking step for defining an implant in the matrix area, a masking step for defining a first-level polysilicon to form floating-gate structures for the memory cells within the matrix area, a matrix masking step for etching away said interpoly dielectric layer from areas outside the matrix area, at least one masking step for defining a second-level polysilicon, and wherein the masking step for defining the first-level polysilicon includes removal of the polysilicon from the active area region of the thick-oxide transistor.

The present invention also provides an integrated circuit on a semiconductor material substrate. The integrated circuit comprises at least one matrix of non-volatile memory cells, wherein each cell has an electrically conductive floating gate, formed by a masking operation for defining a first-level polysilicon layer, which is isolated electrically between a first dielectric layer of silicon oxide and a second dielectric layer including at least one layer of silicon oxide; and further comprising in regions peripheral to the matrix, at least a first type of transistors including an active area region having a thick gate oxide, wherein said thick gate oxide of said transistors comprises said first and second dielectric layers.

The features of this invention will be more clearly apparent from the following detailed description of embodiments thereof, shown in the accompanying drawings by way of non-limiting examples.

BRIEF DESCRIPTION OP THE DRAWINGS

DETAILED DESCRIPTION OF A PREFERRED EMBODIMENT OF THE INVENTION

Figure 1:
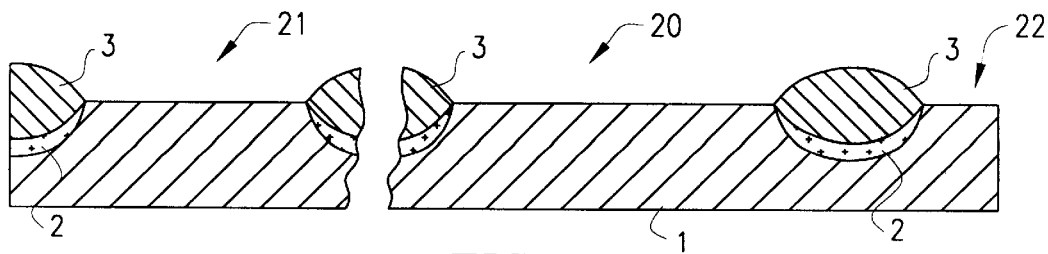
FIGS. 1–9 illustrate a process according to the invention.

A process for forming memory cells and thick-oxide transistors in accordance with the invention will now be described with reference, in particular, to a preferred embodiment thereof, illustrated by FIGS. 1–9. These figures are sectional views, not drawn to scale, showing schematically the sequential process steps of forming a non-volatile memory cell, a thick-oxide MOS transistor, and a direct contact. The partial constructions of the cell, the transistor and the direct contact are denoted by the reference numerals 20, 21 and 22, respectively.

The basic construction of the memory cell 20 is that of all non-volatile memory cells, of either the EPRON, EEPROM or FLASH type, and comprised of a floating-gate MOS transistor. Thick-oxide transistor 21 is a MOS transistor formed in accordance with the invention. The process specifically referred to in this description is a process of the MOS type, preferably as carried out with CMOS technology. The process of this invention may include conventional steps of forming, in a semiconductor substrate having conductivity of a first type, well regions with a second type of conductivity.

The definition of active areas may be performed using a LOCOS (trademark of Philips, The Netherlands) method or PLANOX (Applicant's trademark) method, which may include an isolation implant for the areas where a thick layer of field oxide is to be grown to yield a structure like that shown in FIG. 1. In FIG. 1, reference 1 designates a monocrystalline semiconductor having a given type of conductivity on which the active areas are defined by isolating diffusions 2 and field oxide 3.

Figure 2:
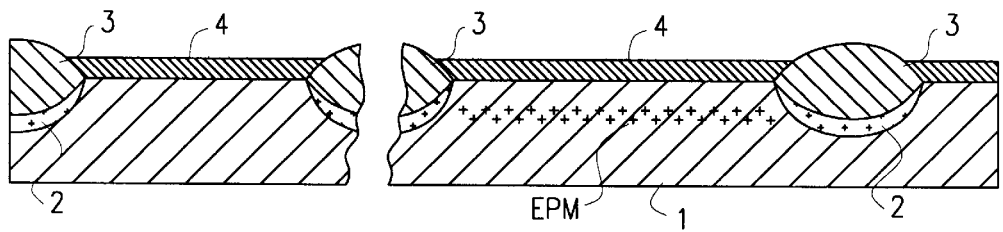

By an extensively used technique, a light implantation may be performed during this step at a high implanting energy, to provide an APT (Anti-Punch Through) implant, not shown to avoid overcrowded drawing figures. Also during this step, a relatively heavy implantation (EPM) is commonly performed, limited to the matrix area, by implanting a boron dosage of about $6.5 \times 10^{12}$ at 120 keV, for example. Unlike the APT implant, the latter implant is shown in the drawing figures as EPM. Again in conducting a standard process sequence, a thin oxide layer 4 of a first type, having a thickness of 100 to 120 Å, is then formed over the active areas, as shown in FIG. 2.

Figure 3:
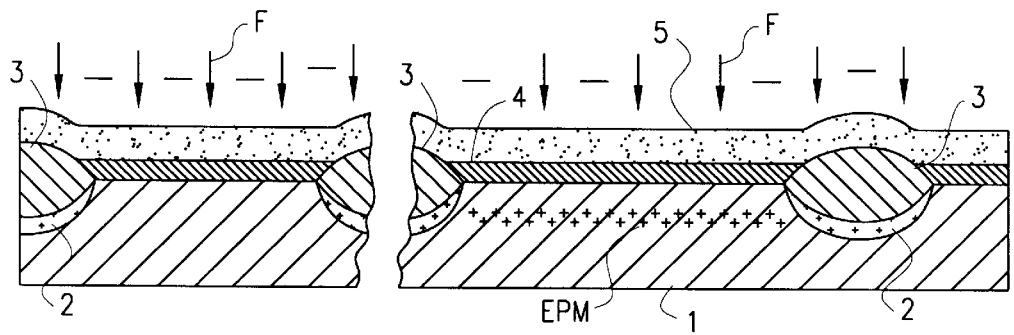
Figure 4:
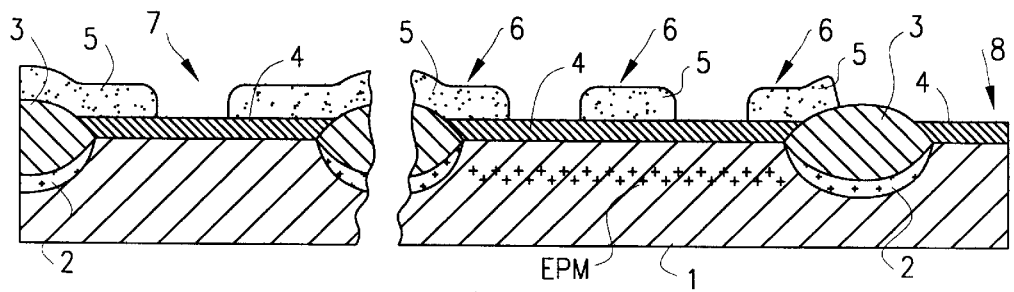

The process is continued with the deposition of a first polysilicon layer 5 (poly 1), which is suitably doped with phosphorus (F), as shown in FIG. 3. This is followed by a masking/etching step carried out on the poly 1 to define the floating gate 6 structures within the matrix area, and in accordance with the invention, remove the first-level polysilicon layer 5 (poly 1) from an active area or region 7 of transistor 21, as shown schematically in FIG. 4.

Figure 5:
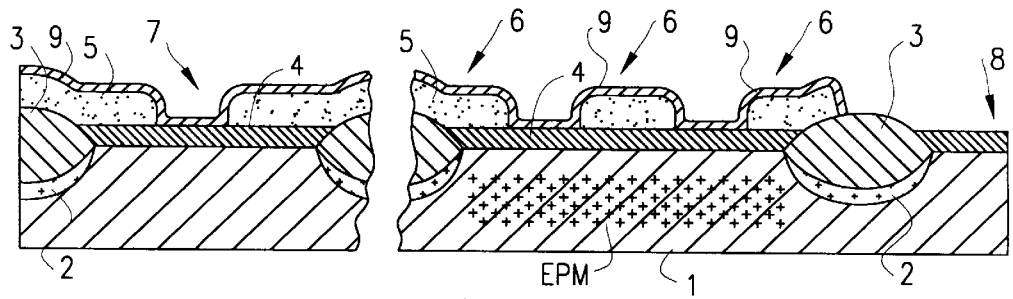

As shown in FIG. 5, a thermal oxidation treatment is applied next which may also include intermediate steps of nitride deposition by a conventional technique to form a second type of oxide layer 9 serving as an interpoly isolation dielectric for the memory cell 20. This oxide layer 9 of the second type overlies the existing oxide layer 4 of the first type at the active area 7 of the transistor 21 and the contact area 8 farthest to the right in the figures. Thus, there will occur, in the active area 7 of the transistor 21, a superposition of two oxide layers, namely of the first-type oxide 4 and the second-type oxide 9. These oxide layers form, in accordance with the invention, a thick oxide whereon the transistor gate will then be formed. The thermal oxidation treatment also causes the dopant implanted during the EPM implantation step to be diffused, as marked symbolically in FIG. 5.

Figure 6:
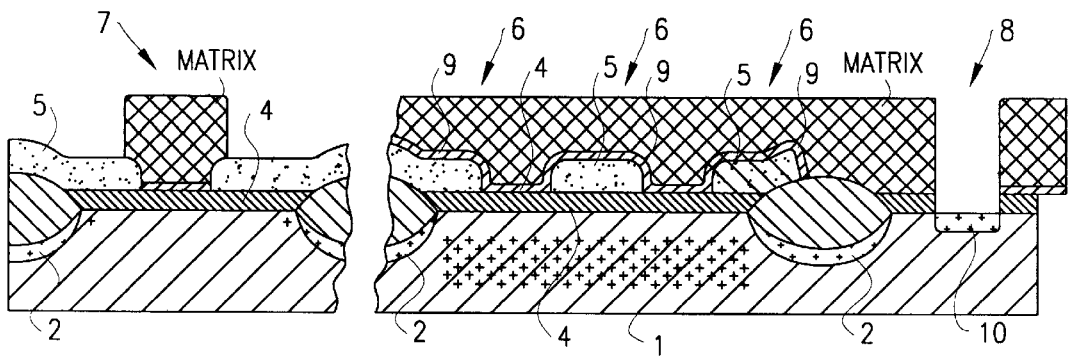

According to the invention, and as shown in FIG. 6, the so-called matrix mask is then formed to define a center or channel area of transistor 21, as shown on the left in the sectional views which illustrate the formation of the active area 7 of thick-oxide transistor 21. Upon removal of the matrix mask, therefore, the channel or active area 7 of the transistor 21 will be covered with a thick oxide layer of about 300 Å, resulting from the superposed oxide layers of the first and second types 4 and 9, respectively.

Figure 7:
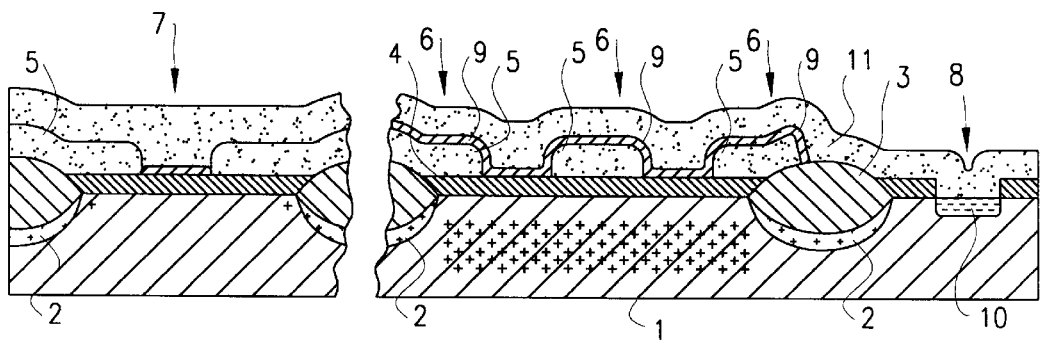
Figure 8:
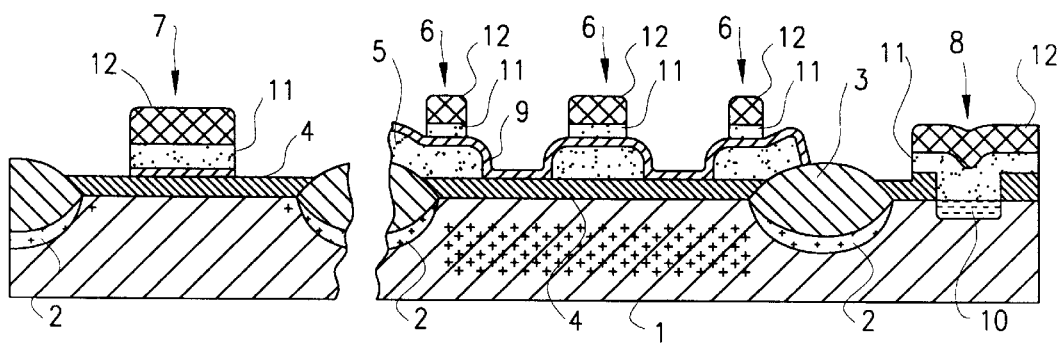

A second layer 11 of poly 2 polycrystalline silicon is deposited next, as shown in FIG. 7. This is followed by the formation of a mask 12 defining the second-level polycrystalline silicon or poly 2 as shown in FIG. 8. By etching away the polysilicon through the poly 2 mask 12, the gate structure of the thick-oxide transistor 21 is defined as illustrated by the sectional view of FIG. 8.

Figure 9:
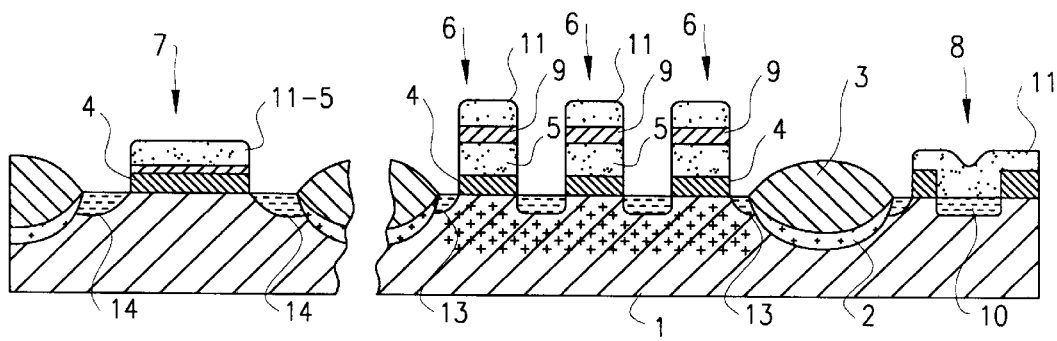

FIG. 9 is a sectional view showing the structure after the poly 2 mask is removed, and the source and drain regions of the integrated structures are implanted and diffused.

Figure 10:
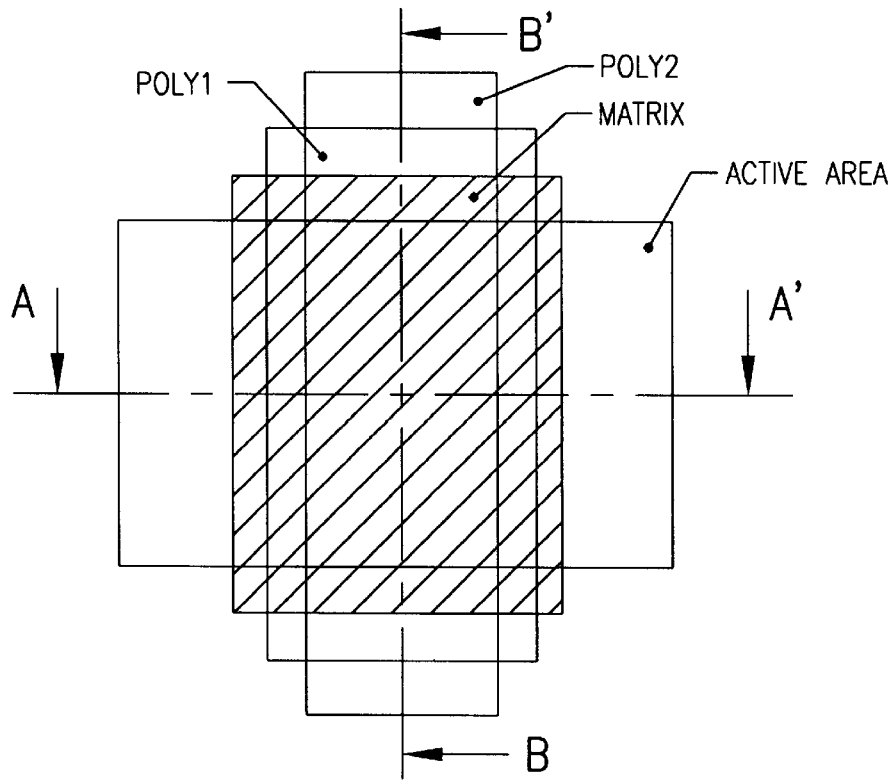
FIG. 10 is a plan view of the profiles of the masks used to define the thick-oxide transistor structure in a process according to the invention.
Figure 11:
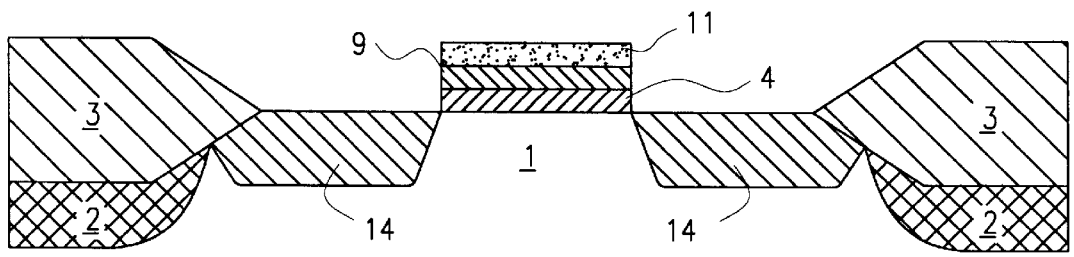
FIG. 11 is a sectional view of the thick-oxide transistor structure taken along line A–A' in FIG. 10.
Figure 12:
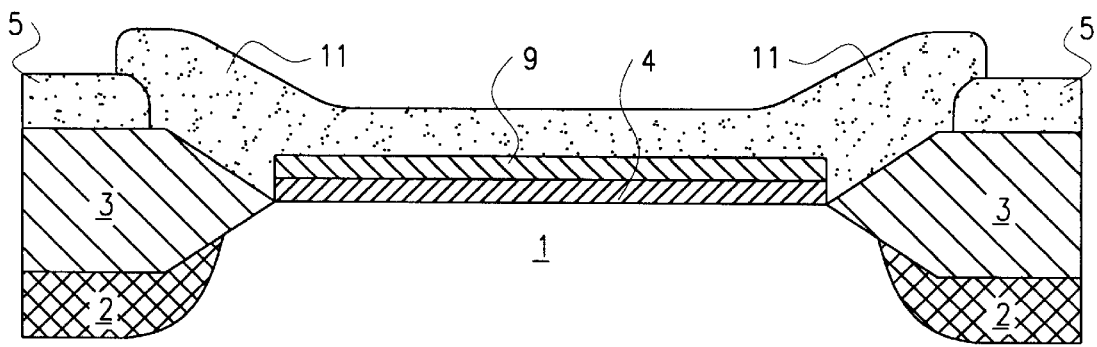
FIG. 12 is a sectional view of the thick-oxide transistor structure taken along line B–B' in FIG. 10, orthogonally with the section view of FIG. 11.

The architecture of the thick-oxide transistor 21 provided by the invention is fully illustrated in FIGS. 10, 11 and 12, which are respectively plan views of the related poly 1 and matrix and poly 2 active area masks, and two cross sections taken orthogonally through the transistor structure.

The poly 2 layer 11 over the thick-oxide transistor area is short-circuited to the poly 1 layer 5 by direct superposition on the latter, over the field oxide 3, as shown by section B–B' in FIG. 12.

In practice, the present invention allows thick-oxide transistors to be made through the utilization of classic masking operations in a dual polysilicon level process (of the DPCC type), thereby avoiding the need for an additional masking step, such as is required instead in conventional processes used to also form thick-oxide transistors. The process of the present invention accomplishes the above without introducing difficulties at the production stage.

It should be understood that many changes and modifications may be made to the foregoing process for making non-volatile memory cells and thick-oxide transistors in accordance with the invention, without departing from the invention scope as defined in the appended claims.

What is claimed is:

1. A process for making a thick-oxide transistor having an active area in an integrated circuit which also includes a matrix area of floating-gate non-volatile memory cells, the process comprising the steps of:

defining the active area of the thick-oxide transistor;

defining an implant in the matrix area;

simultaneously forming a first dielectric layer over the active area of the thick-oxide transistor and the matrix area, the first dielectric layer over the active area of the thick-oxide transistor and the matrix area being essentially the same thickness;

forming a first-level polysilicon layer over the matrix area to form floating-gate regions for the memory cells within the matrix area;

forming an interpoly dielectric layer over the active area of the thick-oxide transistor and the matrix area, the interpoly dielectric layer and the first dielectric layer in the active area of the thick-oxide transistor comprising the gate dielectric thereof; and forming and patterning a second-level polysilicon layer over the active area of the thick-oxide transistor and the matrix area, said patterned second-level polysilicon layer over the active area comprising the gate of the thick-oxide transistor.

2. The process according to claim 1, wherein the step of forming said interpoly dielectric layer over the active area of said thick-oxide transistor includes the step of patterning said interpoly dielectric layer over the active area so as to define a channel area of the thick-oxide transistor.

3. The process according to claim 1, wherein the first dielectric layer and the interpoly dielectric layer overlap to form a single thick layer of oxide over the active area of the thick-oxide transistor.

4. The process according to claim 1, wherein said process is a CMOS process.

5. The process according to claim 1, further comprising the step of:

defining source and drain regions for the thick-oxide transistor.

6. The process according to claim 1, further including the step of:

defining well regions of a first conductivity type in a semiconductor substrate of a second conductivity type which is different from the first conductivity type.

7. A method of manufacturing an integrated circuit including at least one floating gate transistor and at least one single gate transistor, comprising the steps of:

defining an active area of the floating gate transistor and the single gate transistor over a semiconductor material;

simultaneously forming a first dielectric layer on an exposed substrate over the active area of the floating gate transistor and the single gate transistor;

forming a first polysilicon layer over the active area of the floating gate transistor, the first polysilicon layer forming the floating gate of the floating gate transistor;

forming a second dielectric layer over the active area of the floating gate transistor and the single gate transistor, the second dielectric layer overlapping the first dielectric layer in the active area of the single gate transistor so as to form the gate oxide thereof;

forming a second polysilicon layer over the active area of the floating gate transistor and the single gate transistor, the second polysilicon layer in the active area of the single gate transistor forming the gate thereof; and forming source and drain regions in the semiconductor material for the single gate transistor.

8. The method of claim 7, wherein:

the step of forming the second dielectric layer includes the step of patterning the second dielectric layer over the active area of the single gate transistor so as to define a channel region thereof.

9. The method of claim 7, wherein:

the second dielectric layer over the active area of the floating gate transistor comprises an interpolysilicon oxide layer therefor.

10. The method of claim 7, wherein:

the first and second dielectric layers form a single gate oxide of the single gate transistor.

11. The method of claim 7, further including the step of:

prior to the step of forming a first polysilicon layer, implanting a dopant in the active area of the floating gate transistor; and wherein the step of forming the second dielectric layer diffuses the implanted dopant into the semiconductor material.

12. The method of claim 7, wherein:

the gate oxide formed by the overlapping of the first and second dielectric layers is approximately 300 Angstrom units thick.

13. A method of creating an integrated circuit including at least one memory cell transistor and a thick oxide transistor, comprising the steps of:

defining an active area of the memory cell transistor and the active area of the thick oxide transistor over a semiconductor material;

simultaneously forming a first dielectric layer over the active area of the memory cell transistor and the thick oxide transistor, the first dielectric layer being formed on an exposed substrate;

forming a first polysilicon layer over the active area of the memory cell transistor, the first polysilicon layer forming a first control terminal of the memory cell transistor;

forming a second dielectric layer over the active area of the memory cell transistor and the thick oxide transistor, the second dielectric layer and the first dielectric layer in the active area of the thick oxide transistor forming the gate oxide thereof;

forming a second polysilicon layer over the active area of the memory cell transistor and the thick oxide transistor, the second polysilicon layer in the active area of the thick oxide transistor forming the gate thereof and the second polysilicon layer in the active area of the memory cell transistor forming a second control terminal thereof; and forming source and drain regions in the semiconductor material for the thick oxide transistor.

14. The method of claim 13, wherein:

the step of forming the second dielectric layer overlays the first polysilicon layer with the second dielectric layer in the active area of the memory cell transistor; and the step of forming the second polysilicon layer overlays the second dielectric layer in the active area of the memory cell transistor with the second polysilicon layer such that the first and second control terminals of the memory cell transistor are parallel to the substrate plane.

15. The method of claim 13, wherein:

the memory cell transistor comprises a floating gate transistor.

16. The method of claim 13, wherein:

the step of forming the second dielectric layer includes the step of patterning the second dielectric layer over the active area of the thick oxide transistor so as to define the channel region thereof.

17. The method of claim 13, wherein:

the second dielectric layer overlaps the first dielectric layer in the active area of the thick oxide transistor so as to form a single oxide layer comprising the gate oxide of the thick oxide transistor.

18. The method of claim 17, wherein:

the gate oxide formed by the overlapping of the first and second dielectric layers is approximately 300 Angstrom units thick.

19. A process for making a thick-dielectric transistor having an active area in an integrated circuit which also includes a matrix area of floating-gate non-volatile memory cells, the process comprising the steps of:

simultaneously forming a first dielectric layer on an exposed substrate over both the active area of the thick-oxide transistor and the matrix area, the first dielectric layer having essentially the same thickness over both the active area of the thick-oxide transistor and the matrix area;

forming a first-level polysilicon layer on the first dielectric layer over both the active area of the thick-dielectric transistor and the matrix area, the first-level polysilicon layer defining floating-gate regions for the memory cells within the matrix area;

defining floating gate structures within the matrix area by masking/etching the first-level polysilicon layer, the first-level polysilicon layer being removed from the active area of the thick-oxide transistor to expose the first dielectric layer;

simultaneously forming a second dielectric layer on the exposed first dielectric layer in the active area of the thick-dielectric transistor and on the first-level polysilicon layer of the matrix area, the combination of the first and second dielectric layers form the gate dielectric of the thick-dielectric transistor, the second dielectric layer forming an interpoly dielectric layer for the memory cells; and simultaneously forming a second-level polysilicon layer on the second dielectric layer in the active area of the thick-dielectric transistor and on the second dielectric layer of the memory cells, the second-level polysilicon layer comprising the gate of the thick-oxide transistor.

20. The process according to claim 19, wherein the first dielectric layer is an oxide layer.

21. The process according to claim 19, wherein the second dielectric layer overlies the first dielectric layer and a contact area.

22. The process according to claim 19, wherein the first and second dielectric layers are different types of oxide layers.

23. The process according to claim 19, wherein the first dielectric layer is a thickness of 100 to 120 Angstroms.

24. The process according to claim 19, wherein the first and second dielectric layers combine to form a thickness of about 300 Angstroms.

25. The process according to claim 19, wherein the first-level polysilicon layer is doped with phosphorus.

\* \* \* \* \*

UNITED STATES PATENT AND TRADEMARK OFFICE
CERTIFICATE OF CORRECTION

PATENT NO. : 6,156,610　　　　　　　　　　　　　　　　　　　　Page 1 of 1
DATED : December 5, 2000
INVENTOR(S) : Paolo Rolandi It is certified that error appears in the above-identified patent and that said Letters Patent is hereby corrected as shown below:

Column 3,
Line 40, replace "EPRON" with -- EPROM --

Signed and Sealed this

Twelfth Day of March, 2002

Attest:

Attesting Officer

JAMES E. ROGAN
Director of the United States Patent and Trademark Office